United States Patent
Tanaka

(10) Patent No.: US 10,421,661 B2
(45) Date of Patent: Sep. 24, 2019

(54) FUNCTIONAL ELEMENT, ELECTRONIC APPARATUS AND MOBILE ENTITY

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 12 days.

(21) Appl. No.: 15/797,459

(22) Filed: Oct. 30, 2017

(65) Prior Publication Data
US 2018/0050899 A1 Feb. 22, 2018

Related U.S. Application Data

(63) Continuation of application No. 14/696,709, filed on Apr. 27, 2015, now Pat. No. 9,828,235.

(30) Foreign Application Priority Data

May 1, 2014 (JP) .................................. 2014-094455

(51) Int. Cl.
*B81B 3/00* (2006.01)
*G01P 15/125* (2006.01)
(Continued)

(52) U.S. Cl.
CPC .......... *B81B 3/0051* (2013.01); *G01P 15/125* (2013.01); *B81B 2201/0235* (2013.01);
(Continued)

(58) Field of Classification Search
CPC .......... B81B 3/0051; B81B 2203/0181; B81B 2201/0235; G01P 2015/0814;
(Continued)

(56) References Cited

U.S. PATENT DOCUMENTS 5,581,035 A 12/1996 Greiff
6,065,341 A 5/2000 Ishio et al.
(Continued)

FOREIGN PATENT DOCUMENTS

JP 09-127151 A 5/1997
JP 11-173851 A 7/1999
(Continued)

*Primary Examiner* — David M. Gray
*Assistant Examiner* — Andrew V Do
(74) *Attorney, Agent, or Firm* — Harness, Dickey & Pierce, P.L.C.

(57) ABSTRACT

An acceleration sensor includes a substrate, a support beam, a weight body a stationary section and an engaging section. The weight body is divided into a first weight section and a second weight section based on the support beam as a boundary line, and the first weight section and the second weight section have different weights from each other. The first weight section and the second weight section include a facing section which faces a side of the engaging section opposite to a side facing the support beam. In an X axis direction intersecting the Y axis direction, if a distance between a corner section of the engaging section in the vicinity of one end portion and the support beam is L1 and a distance between the engaging section and the facing section is L2, a relational expression, L1>L2 is satisfied.

20 Claims, 10 Drawing Sheets

(51) Int. Cl.
*G01C 19/5656* (2012.01)
*G01P 15/08* (2006.01)

(52) U.S. Cl.
CPC .. *B81B 2203/0181* (2013.01); *G01C 19/5656* (2013.01); *G01P 2015/0814* (2013.01)

(58) Field of Classification Search
CPC ..... G01P 2015/0831; G01P 2015/0871; G01P 15/125
See application file for complete search history.

(56) References Cited

U.S. PATENT DOCUMENTS

| | | |
|---|---|---|
| 2002/0011112 A1 | 1/2002 | Kipp et al. |
| 2013/0042684 A1 | 2/2013 | Yoda |
| 2013/0192370 A1 | 8/2013 | Yoda |
| 2013/0228013 A1 | 9/2013 | Tanaka |
| 2013/0263662 A1 | 10/2013 | Tanaka |
| 2015/0096378 A1 | 4/2015 | Kigure |
| 2015/0268268 A1* | 9/2015 | Liu ............ G01P 15/125 73/514.32 |

FOREIGN PATENT DOCUMENTS

| | | |
|---|---|---|
| JP | 11-230985 A | 8/1999 |
| JP | 2002-022763 A | 1/2002 |
| JP | 2004-045269 A | 2/2004 |
| JP | 2005-166748 A | 6/2005 |
| JP | 2010-210430 A | 9/2010 |
| JP | 2011-174881 A | 9/2011 |
| JP | 2012-181030 A | 9/2012 |
| JP | 2013-040856 A | 2/2013 |
| JP | 2013-156121 A | 8/2013 |
| JP | 2013-181855 A | 9/2013 |
| JP | 2013-217721 A | 10/2013 |

* cited by examiner

FUNCTIONAL ELEMENT, ELECTRONIC APPARATUS AND MOBILE ENTITY

CROSS-REFERENCE TO RELATED APPLICATIONS

This application is a continuation of U.S. patent application Ser. No. 14/696,709, filed Apr. 27, 2015, which claims priority to Japanese Patent Application No. 2014-094455, filed May 1, 2014, the disclosures of which are hereby expressly incorporated by reference herein in their entireties.

BACKGROUND

1. Technical Field

The present invention relates to a functional element, a physical quantity sensor including the functional sensor, an electronic apparatus, and a mobile entity.

2. Related Art

Recently, for example, as a physical quantity sensor which includes a functional element for detecting physical quantities such as an acceleration and an angular velocity, there has become known a capacitance type acceleration sensor (hereinafter referred to as acceleration sensor) which includes a substrate, a stationary electrode fixed on the substrate, a movable electrode disposed so as to face the top surface of the stationary electrode, and an elastic support section for elastically supporting the movable electrode on the substrate so as to be displaced in a direction orthogonal to the top surface of the substrate (for example, JP-A-2012-181030).

In the acceleration sensor, the elastic support section includes a lower layer support section fixed on the substrate, an upper layer support section fixed on the lower layer support section, and a beam section which has an elongated shape along the top surface of the substrate, of which one end portion is coupled to the upper layer support section and of which the other end portion is coupled with the movable electrode.

FIG. 14A and FIG. 14B are schematic plan views showing a configuration of a main portion of an acceleration sensor according to the related art described above. FIG. 14A shows a still state and FIG. 14B shows an impacting state. Further, the X axis, the Y axis and the Z axis indicate coordinate axes which are orthogonal to each other.

As shown in FIG. 14, in the acceleration sensor 500 of the related art, the elastic support section 501 includes a lower layer support section 503 fixed on the substrate 502, an upper layer support section 504 fixed on the lower layer support section 503, and a beam section 506 which has an elongated shape along the top surface of the substrate 502 in the Y axis direction, of which one end portion is coupled with the upper layer support section 504 and of which the other end portion is coupled with the movable electrode 505.

With an acceleration applied in the Z axis direction (the direction orthogonal to paper surface), the acceleration sensor 500 is configured to detect a difference based on the variation of the capacitances between the movable electrode 505 and two stationary electrode sections 507 and 508 on the substrate 502 due to swinging of the movable electrodes 505 around the beam section 506 as an axis (by twisting of the beam section 506) in the manner of a seesaw in the Z axis direction, and thus to derive the acceleration from the detected result.

With reference to "FIG. 3", "FIG. 7" and the like in JP-A-2012-181030, in the acceleration sensor 500, when a gap between the beam section 506 and the upper layer support section 504 is L1 and a gap between the upper layer support section 504 and the movable electrode 505 is L2 in the X axis direction, during the still state as shown in FIG. 14A, there is a relational expression, L1<L2.

In this state, as shown in FIG. 14B, in the acceleration sensor 500, when an impact is applied from outside in the X axis direction, that is, for example, when the impact is applied in the + (plus) X axis direction (the dashed line arrow), the movable electrode 505 is rapidly moved in the − (minus) X axis direction according to an inertia (the solid line arrow).

In this case, since there is the relational expression, L1<L2 in the acceleration sensor 500, the beam section 506 which was bent in the −X axis direction collides with a corner section of the upper layer support section 504, before the movable electrode 505 contacts the upper layer support section 504.

Herein, since the beam section 506 is necessarily twisted to cause the movable electrode 505 to swing in the manner of a seesaw in the Z axis direction, there is a certain constraint on rigidity of the beam section.

As a result, in the acceleration sensor 500, there is a problem that the collision described above may cause the beam section 506 to be damaged, and it is necessary to improve the impact resistance thereof.

SUMMARY

The invention can be realized in the following form or application examples.

APPLICATION EXAMPLE 1

According to this application example, there is provided a functional element including a substrate; a support beam which extends in a first direction along with a main surface of the substrate; a weight body which is connected to one end portion of the support beam to swing in a second direction intersecting the main surface; a stationary section which is connected to the other end of the support beam and is fixed to the substrate; and an engaging section which is disposed between the weight body and the support beam when seen in a plan view. In a third direction intersecting the first direction when seen in the plan view, if a distance between the engaging section and the support beam is L1 and a distance between the engaging section and the weight body is L2, a relational expression, L1>L2 is satisfied.

Accordingly, in the functional element, in the third direction intersecting the first direction when seen in the plan view, if the distance between the engaging section and the support beam is L1 and the distance between the engaging section and the weight body is L2, the relational expression, L1>L2 is satisfied.

Therefore, in the functional element, for example, when an impact is applied from outside in the third direction, the weight section firstly contacts the engaging section before contacting the support beam. Therefore, it is possible to suppress the damage of the support beam.

As a result, it is possible to further improve the impact resistance in the functional element, compared with the case of the configuration of JP-A-2012-181030.

APPLICATION EXAMPLE 2

In the functional element according to the application example, it is preferable that a corner section of the support beam in the engaging section is cut off or rounded when seen in the plan view.

Accordingly, in the functional element, the corner section in the engaging section is cut off or rounded when seen in the plan view. Therefore, even if the support beam is contacted with the corner section of the engaging section, the rounding of the angle causes an impact force to be dispersed and thus it is possible to suppress the damage of the support beam.

APPLICATION EXAMPLE 3

In the functional element according to the application example, it is preferable that at least one of the engaging section and the weight body is provided with a protrusion section which protrudes toward a mate side which faces the protrusion section, and a distance between a tip of the protrusion section and the facing mate corresponds to L2.

Accordingly, in the functional element, at least one of the engaging section and the weight body is provided with the protrusion section which protrudes toward the mate side which faces the protrusion section, and the distance between the tip of the protrusion section and the facing mate corresponds to L2. Therefore, one portion on which the protrusion section is provided can have a larger shape tolerance in portions other than the protrusion section.

As a result, it is possible to improve the productivity in the functional element, compared with a case where the protrusion section is not provided.

Further, in the functional element, it is possible for the protrusion section to cause the occurrence of attachment between the engaging section and the weight body to be avoided.

APPLICATION EXAMPLE 4

In the functional element according to the application example, it is preferable that the weight body is divided into a first weight section and a second weight section based on the support beam as a boundary line, and the first weight section and the second weight section have different weights from each other and are provided with a movable electrode. Further, it is preferable that the substrate includes a first stationary electrode section which is located at a position overlapped with the movable electrode section of the first weight section when seen in the plan view, and the substrate includes a second stationary electrode section which is located at a position overlapped with the movable electrode section of the second weight section when seen in the plan view.

Accordingly, in the functional element, the first weight section and the second weight section in the weight body are provided with a movable electrode. Further, the substrate includes the first stationary electrode section and the second stationary electrode section which are located at a position overlapped with the movable electrode section of the first weight section and the second weight section when seen in the plan view.

For this reason, the functional element can detect, for example, the acceleration applied in the second direction based on the variation of the capacitances between the swung movable electrode section of the first weight section and the second weight section and the first stationary electrode section and the second stationary electrode section.

APPLICATION EXAMPLE 5

In the functional element according to the application example, it is preferable that the support beam, the stationary section and the engaging section are disposed inside the weight body, when seen in the plan view.

Accordingly, in the functional element, the support beam, the stationary section and the engaging section are disposed inside the weight body, when seen in the plan view. Therefore, the support beam, the stationary section and the engaging section are hardly affected by a change of the ambient temperature (for example, heat stress and the like), compared with a case where the support beam, the stationary section and the engaging section are disposed outside the weight body.

As a result, in the functional element, it is possible to improve the temperature characteristics (a degree of change of the detection characteristics and the like according to the change of the temperature).

APPLICATION EXAMPLE 6

In the functional element according to the application example, it is preferable that the support beam, the stationary section and the engaging section are disposed outside the weight body, when seen in the plan view.

Accordingly, in the functional element, the support beam, the stationary section and the engaging section are disposed outside the weight body, when seen in the plan view. Therefore, it is possible to decrease the size of the opening of the weight body, and to increase the weight of the weight body, compared with a case where the support beam, the stationary section and the engaging section are disposed inside the weight body.

As a result, in the functional element, it is possible to improve the sensitivity of the physical quantity detection.

APPLICATION EXAMPLE 7

According to one aspect of this application example, there is provided a physical quantity sensor including the functional element according to any one of the above application examples.

Accordingly, the physical quantity sensor according to this configuration includes the functional element according to any one of the above application examples. Therefore, it is possible to provide the physical sensor having the effects described in any one of the above application examples.

APPLICATION EXAMPLE 8

According to one aspect of this application example, there is provided an electronic apparatus including the functional element according to any one of the above application examples.

Accordingly, the electronic apparatus according to this configuration includes the functional element according to any one of the above application examples. Therefore, it is possible to provide the electronic apparatus having the effects described in any one of the above application examples.

APPLICATION EXAMPLE 9

According to one aspect of this application example, there is provided a mobile entity including the functional element according to any one of the above application examples.

Accordingly, the mobile entity according to this configuration includes the functional element according to any one of the above application examples. Therefore, it is possible to provide the mobile entity having the effects described in any one of the above application examples.

BRIEF DESCRIPTION OF THE DRAWINGS

The invention will be described with reference to the accompanying drawings, wherein like numbers reference like elements.

FIG. 1A is a schematic plan view and FIG. 1B is a schematic sectional view taken along line IA-IA of FIG. 1A.

FIG. 8A is a schematic plan view and FIG. 8B is a schematic sectional view taken along line VIIIB-VIIIB of FIG. 8A.

FIG. 14A shows a still state and FIG. 14B shows an impacting state.

DESCRIPTION OF EXEMPLARY EMBODIMENTS

Hereinafter, the embodiments for concretely implementing the invention will be described with reference to the accompanied drawings.

Figure 1A:
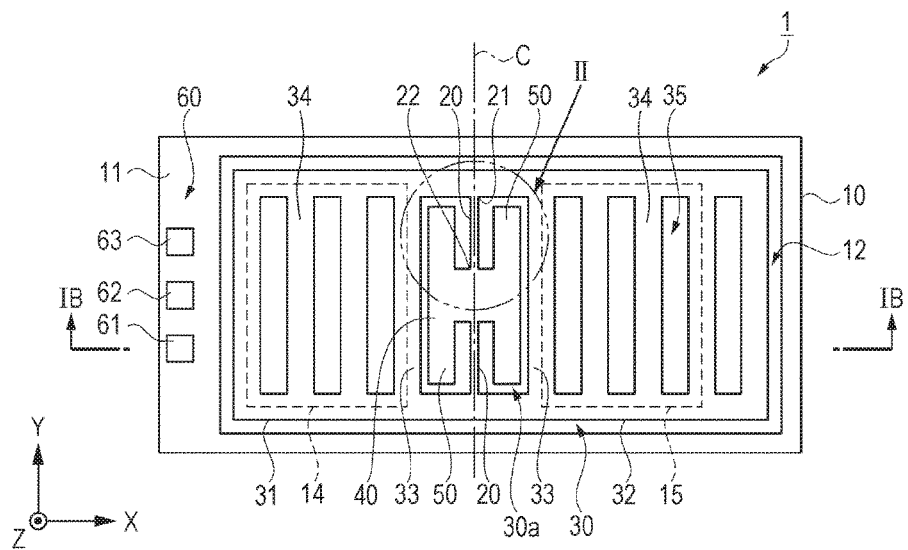
FIG. 1A and FIG. 1B are schematic views showing a configuration of an acceleration sensor according to the first embodiment.
Figure 1B:
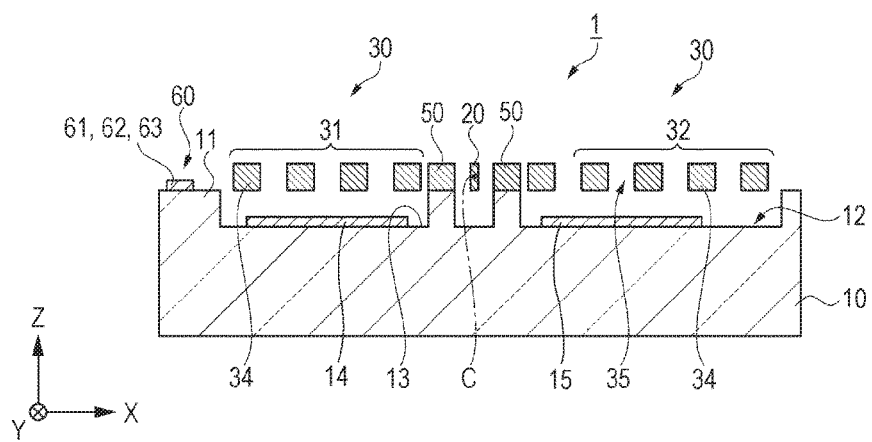
Figure 2:
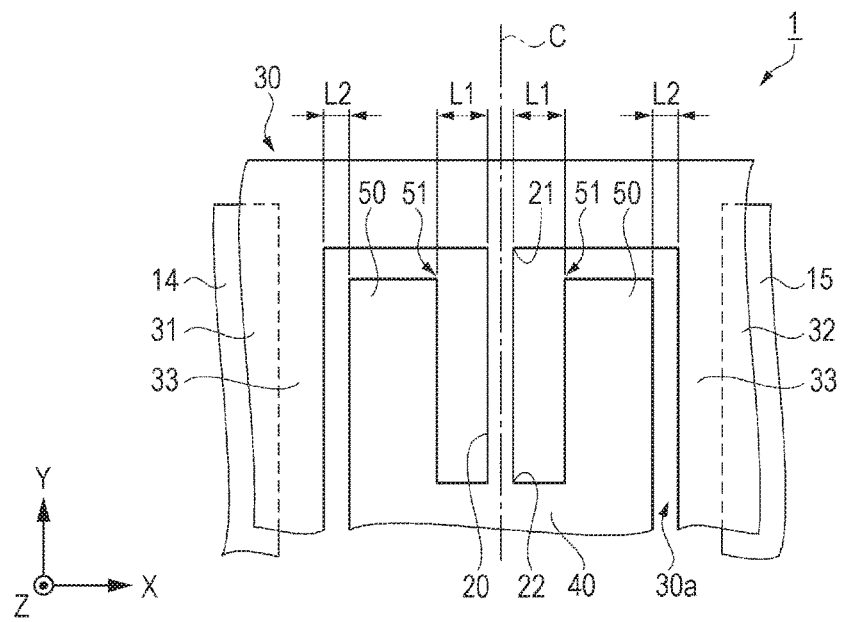
FIG. 2 is a schematic enlarged view showing portion II surrounded with a two-dotted chain line in FIG. 1A.

Firstly, an acceleration sensor will be described as an example of a physical quantity sensor including a functional element.
First Embodiment FIG. 1A and FIG. 1B are schematic views showing a configuration of an acceleration sensor according to one aspect of the first embodiment. FIG. 1A is a schematic plan view and FIG. 1B is a schematic sectional view taken along line IA-IA of FIG. 1A. FIG. 2 is a schematic enlarged view showing portion II surrounded with a two-dotted chain line in FIG. 1A.

In the respective drawings including and subsequent to FIG. 1A and FIG. 1B, a dimensional proportion of each configuration element may be set to be different from that used in practice in order to facilitate understanding. Further, in the drawings, the X axis, the Y axis and the Z axis are coordinate axes orthogonal to each other, and arrows indicate + directions.

As shown in FIG. 1A and FIG. 1B, the functional element which is provided in the acceleration sensor 1 includes a substantially rectangular planar substrate 10, a pair of support beams 20, a substantially rectangular planar weight body 30, a stationary section 40 and an engaging section 50 (herein, the functional element=the acceleration sensor is assumed for convenience of description, and the same applies to the following embodiment).

More specifically, the acceleration sensor 1 includes the substrate 10 which extends in the X axis direction, the pair of support beams 20 which extend in the Y axis direction as the first direction along with a main surface 11 of the substrate 10 along the X-Y plane defined by the X axis and the Y axis, the weight body 30 which is disposed in the upward direction (+Z side) of the substrate 10, which connects to one end portion 21 of the support beam 20, and which is supported by the pair of the support beams 20 so as to swing in the manner of a seesaw in the Z axis direction as the second direction intersecting the main surface 11, and the stationary section 40 which connects to the other end 22 of the support beam 20 and which is fixed to the substrate 10.

Further, when seen in the plan view (when seen in the Z axis direction), the acceleration sensor 1 includes the engaging section 50 which is fixed on the substrate 10 and which is disposed between the weight body 30 and the stationary section 40 while the support beam 20 is interposed between both sides of the engaging section 50.

As shown in FIG. 1A, when seen in the plan view, the support beam 20, the stationary section 40 and the engaging section 50 are disposed at a position to be slightly closer to the −X side from the central portion of the weight body 30 and also are disposed inside an opening 30a which is opened in a substantially rectangular shape.

More specifically, the substantial rectangular stationary section 40 is disposed in the central portion of the opening 30a. The pair of the beam-like support beams 20 overlap an axial line C extending along the Y axis passing through the center of the opening 30a so that one of the support beams 20 may be disposed in the +Y side of the stationary section 40, and the other one of the support beams 20 is disposed in the −Y side of the stationary section 40. Therefore, the opening 30a is divided into two parts in the +X side and −X side by the stationary section 40 and the pair of the support beams 20.

While the support beam 20 is interposed between two sides of the engaging section 50 in the −X side and the +X side from the stationary section 40, the engaging section 50 extends from the stationary section 40 along the Y axis in a substantial rectangular shape in the +Y side and the −Y side. Therefore, the stationary section 40 and the engaging section 50 are integrated with each other and are formed in the form of an H when seen in the plan view. The engaging section 50 coupled with the stationary section 40 is fixed to the substrate 10.

Further, the stationary section 40 and the engaging section 50 may be separate from each other and be formed in an island shape.

The weight body 30 is divided into a first weight section 31 in the −X side and a second weight section 32 in the +X side based on the support beam 20 as a boundary line (the axial line C), and the first weight section and the second weight section have different weights from each other. In this case, the second weight section 32 is formed to be longer in length in the X axis direction and greater in weight than those of the first weight section 31.

The first weight section 31 and the second weight section 32 respectively include a facing section 33 which is a peripheral edge of the opening 30*a*, and faces a side of the engaging section 50 opposite to a side facing the support beam 20.

The weight body 30 is configured to be capable of swinging (rotating) around the axial line C passing through the pair of support beams 20 in the manner of a seesaw in the Z axis direction according to twisting (torsion spring action) of the support beam 20 within a range of elastic deformation thereof.

As shown in FIG. 2, in the acceleration sensor 1, in the X axis direction as the third direction intersecting (herein orthogonally crossing) the Y axis direction when seen in the plan view, a relational expression, L1>L2 is satisfied, where L1 is a distance between a corner section 51 of the engaging section 50 and the support beam 20, the corner section 51 being located near to the support beam 20 in the vicinity of the one end portion 21, and L2 is a distance between the engaging section 50 and the facing section 33.

Again, with reference to FIG. 1A and FIG. 1B, the weight body 30 includes movable electrode sections 34 disposed in the first weight section 31 and the second weight section 32. Herein, the weight body 30 is entirely formed of the movable electrode section 34 because the weight body 30 is formed of a semiconductor substrate such as silicon as described later.

The first weight section 31 and the second weight section 32 are provided with plural through holes 35 which pass through in the Z axis direction. The through holes 35 have a substantial rectangular shape extending in the Y axis direction and are arranged in parallel to the X axis direction, when seen in the plan view.

The acceleration sensor 1 uses the through hole 35 to suppress a gas flow resistance (squeeze film damping) existing between the weight body 30 and the substrate 10 and to cause the weight body 30 to smoothly swing in the Z axis direction when acceleration is applied.

The main surface 11 in the substrate 10 is provided with a concave section 12 through which the weight body 30 can swing in the Z axis direction.

The substrate 10 includes the first stationary electrode section 14 which is located in the bottom 13 of the concave section 12 at a place to be overlapped with the movable electrode section 34 of the first weight section 31 when seen in the plan view. The substrate also includes the second stationary electrode section 15 which is located at a place to be overlapped with the movable electrode section 34 of the second weight section 32 when seen in the plan view.

The first stationary electrode section 14 and the second stationary electrode section 15 have the substantially rectangular shape in the plan view and an identical size to each other in the surface area thereof, and also have a shape of a line symmetric relationship with respect to the support beam 20 (axial line C) when seen in the plan view.

Therefore, the acceleration sensor 1 has a configuration in which the facing area between the movable electrode section 34 of the first weight section 31 and the first stationary electrode section 14, and the facing area between the movable electrode section 34 of the second weight section 32 and the second stationary electrode section 15 are identical to each other.

A terminal section 60 is provided on the end portion of the main surface 11 of the substrate 10 in the −X side.

The terminal section 60 is provided with a common terminal 61, the first terminal 62, and the second terminal 63 arranged side by side in the order listed along the Y axis from the −Y side to the +Y side.

With wirings (not shown) used, the common terminal 61 is electrically connected to the weight body 30 (the movable electrode section 34) through the stationary section 40 and the support beam 20, the first terminal 62 is electrically connected to the first stationary electrode section 14, and the second terminal 63 is electrically connected to the second stationary electrode section 15.

One piece of semiconductor substrate of which main material is semiconductor materials such as silicon is laminated on the main surface 11 of the substrate 10. Further, the one piece of semiconductor substrate is subjected to technical processing such as the photolithography and the etching to thereby form the weight body 30 (the first weight section 31, the second weight section 32 and the facing section 33), the support beam 20, the stationary section 40, and the engaging section 50 in a high precision manner.

Preferably, an insulation material such as glass and a high resistance silicon is used for the material of the substrate 10. Particularly, in a case where the semiconductor substrate configured to include the weight body 30, the support beam 20, the stationary section 40 and the engaging section 50 is formed of the semiconductor material such as silicon as a main material, it is preferable to use glass containing alkali metal ions (movable ions) (for example, borosilicate glass such as Pyrex (a registered mark)) for the material of the substrate 10.

Accordingly, in the acceleration sensor 1, the substrate 10 can be bonded to the semiconductor substrate using the anodic bonding. Further, in the acceleration sensor 1, the glass containing the alkali metal ion is used for the substrate 10 to easily and separately insulate the substrate 10 from the semiconductor substrate.

Further, the substrate 10 may not necessarily have insulating property, but may be a conductive substrate formed of low resistivity silicon in this case, an insulation film may be interposed between the substrate 10 and the semiconductor substrate, and between each stationary electrode and wirings or the like to insulate the substrate 10 from the semiconductor substrate or to insulate each stationary electrode from the wirings or the like.

Preferably, the material of the substrate 10 has a thermal expansion coefficient which is different by as little as possible from that of a semiconductor material. Specifically, the difference in the thermal expansion coefficient between the material of the substrate 10 and the material of the semiconductor substrate is preferably equal to or less than 3 ppm/° C. Accordingly, in the acceleration sensor 1, a residual stress between the substrate 10 and the semiconductor substrate can be reduced.

In a case where the substrate 10, the weight body 30, the support beam 20, the stationary section 40 and the engaging section 50 are subjected to a shape-forming processing for the acceleration sensor 1, reactive ion etching (RIE) or the like is used to perform a vertical etching process so that, for example, a wall surface of the concave section 12 in the substrate 10, a side surface of the weight body 30, the support beam 20, the stationary section 40 and the engaging section 50, and an internal surface of the through hole 35 are orthogonal to the main surface 11 of the substrate 10 or the main surface of the weight body 30 (a surface along the main surface 11 of the substrate 10).

As the reactive ion etching, for example, a process technique based on an etching apparatus having inductively coupled plasma (ICP) may be used.

The materials for the first stationary electrode section 14, the second stationary electrode section 15 and the wiring are not limited particularly as long as the materials have electrical conductivity, but various types of electrode materials may be used. Specifically, the materials may include, for example, oxides (transparent electrode material) such as indium tin oxide (ITO), indium zinc oxide (IZO), $In_2O_3$, $SnO_2$, $SnO_2$ containing Sb, and ZnO containing Al and the like, Au, Pt, Ag, Cu, Al, or alloys containing these materials, and the like, of which one or more of these may be combined so as to be used.

The method (film forming method) of forming the first stationary electrode section 14, the second stationary electrode section 15 and the wiring is not limited particularly, but may include, for example, vacuum deposition, sputtering (low temperature sputtering), dry process plating methods such as ion plating, electrolysis plating, wet process plating methods such as electroless plating, spraying method, filmy joining, and the like.

Herein, the operation of the acceleration sensor 1 will be described.

Figure 3:
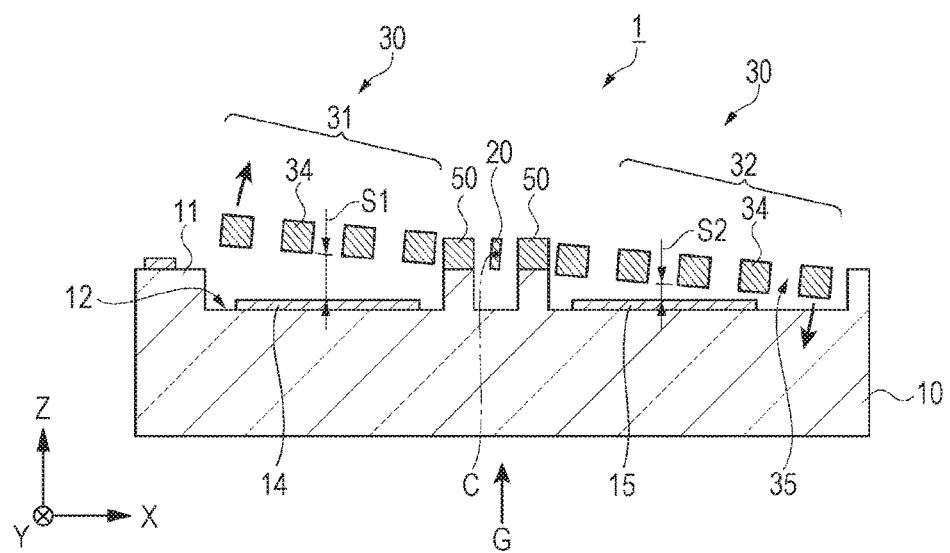
FIG. 3 is a schematic sectional view explaining operation of the acceleration sensor.

FIG. 3 is a schematic sectional view explaining operation of the acceleration sensor, and showing a state where an acceleration as a physical quantity is applied in the X axis direction. The location of the sectional area is the same as that of FIG. 1B.

As shown in FIG. 3, for example, when an acceleration G is applied in the +Z axis direction orthogonal to the main surface 11 of the substrate 10 in the acceleration sensor 1, the weight body 30 swings (rotates) around the axial line C in the manner of a seesaw according to an inertia to be inclined with respect to the substrate 10. Herein, the second weight section 32 having the greater mass descends to be inclined downwardly in the −Z axis direction and the first weight section 31 having the lower mass ascends to be inclined upwardly in the +Z axis direction.

In other words, in the acceleration sensor 1, the first weight section 31 of the weight body 30 is spaced from the first stationary electrode section 14, the second weight section 32 of the weight body 30 approaches to the second stationary electrode section 15.

In this case, the gap S1 between the first stationary electrode section 14 and the first weight section 31 (the movable electrode section 34) increases and the gap S2 between the second stationary electrode section 15 and the second weight section 32 (the movable electrode section 34) decreases. Therefore, the capacitance between the first weight section 31 and the first stationary electrode section 14 decreases, and the capacitance between the second weight section 32 and the second stationary electrode section 15 increases.

Accordingly, based on a difference (a differential capacity) from the capacitance generated in the gap S1 between the first weight section 31 and the first stationary electrode section 14 to the capacitance generated in S2 between the second weight section 32 and the second stationary electrode section 15, the acceleration sensor 1 performs C-V conversion to acquire a voltage waveform and to thereby detect the acceleration G applied to the acceleration sensor 1.

As described above, in the acceleration sensor 1 of the first embodiment, each of the first weight section 31 and the second weight section 32 in the weight body 30 includes the facing section 33 which faces a side of the engaging section 50 opposite to a side facing the support beam 20a.

Further, in the acceleration sensor 1, when seen in the plan view and in the X axis direction intersecting with the Y axis direction, and when a distance between the engaging section 50 (in more detail, a corner section 51 in the support beam 20 of the engaging section 50) and the support beam 20 is assumed to be L1, and a distance between the engaging section 50 and the facing section 33 (the weight body 30) is assumed to be L2, the relational expression, L1>L2 is satisfied.

Figure 4:
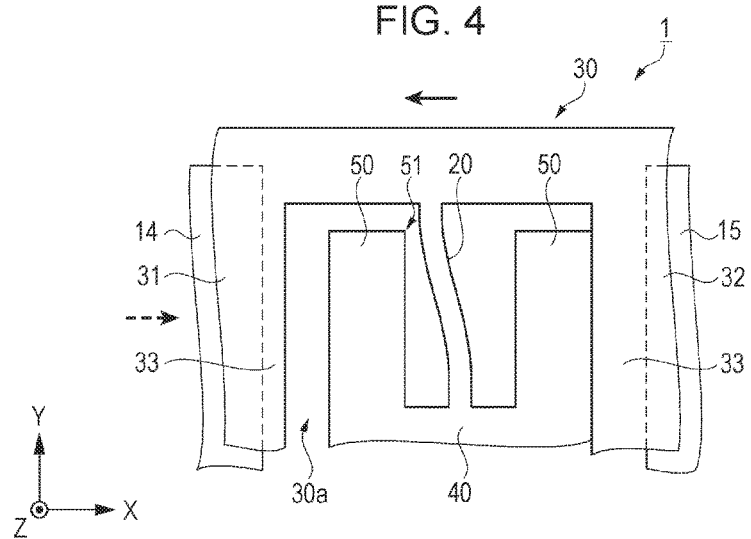
FIG. 4 is a schematic plan view showing a main portion of a state where an impact is applied to the acceleration sensor from outside.

FIG. 4 is a schematic plan view showing a main portion of a state where an impact is applied to the acceleration sensor from outside.

As shown in FIG. 4, for example, when an impact is applied from outside in the +X direction shown as the dashed line arrow, in the acceleration sensor 1, the weight body 30 rapidly moves according to an inertia in the −X axis direction shown as the solid line arrow.

In this case, since the relational expression L1>L2 is satisfied in the acceleration sensor 1, the facing section 33 in the first weight section 31 and the second weight section 32 is contacted with the engaging section 50 before the support beam 20 is contacted with the corner section 51 of the engaging section 50.

Therefore, in the acceleration sensor 1, the support beam 20 easily avoids colliding with the engaging section 50, and thus it is possible to suppress the damage of the support beam 20.

As a result, it is possible to improve the impact resistance in the acceleration sensor 1, compared with the configuration of the related art JP-A-2012-181030.

Further, in the acceleration sensor 1, the weight body 30 includes the movable electrode section 34 in the first weight section 31 and the second weight section 32, and the substrate 10 includes the first stationary electrode section 14 and the second stationary electrode section 15 at a position where the movable electrode section 34 of the first weight section 31 and the second weight section 32 overlaps the first stationary electrode section 14 and the second stationary electrode section 15 when seen in the plan view.

For this reason, the acceleration sensor 1 can detect the acceleration G applied in the Z axis direction based on the variation of the capacitances between the swung (rotated) movable electrode section 34 of the first weight section 31 and the second weight section 32, and the first stationary electrode section 14 and the second stationary electrode section 15.

Further, in the acceleration sensor 1, the support beam 20, the stationary section 40 and the engaging section 50 are disposed inside the weight body 30 (in other words, disposed collectively in one place), when seen in the plan view. Therefore, the support beam 20, the stationary section 40 and the engaging section 50 are hardly affected by a change of the ambient temperature (for example, an influence on the acceleration detection characteristics based on a difference in magnitude of heat stress generated due to the location, and the like), compared with a case where the support beam 20, the stationary section 40 and the engaging section 50 are disposed to be separate from each other outside the weight body 30 as described later in the second embodiment.

As a result, in the acceleration sensor 1, it is possible to improve the temperature characteristics (a degree of change of the acceleration detection characteristics and the like according to the change of the temperature).

Hereinafter, a modification example of the first embodiment will be described.

First Modification Example

Figure 5:
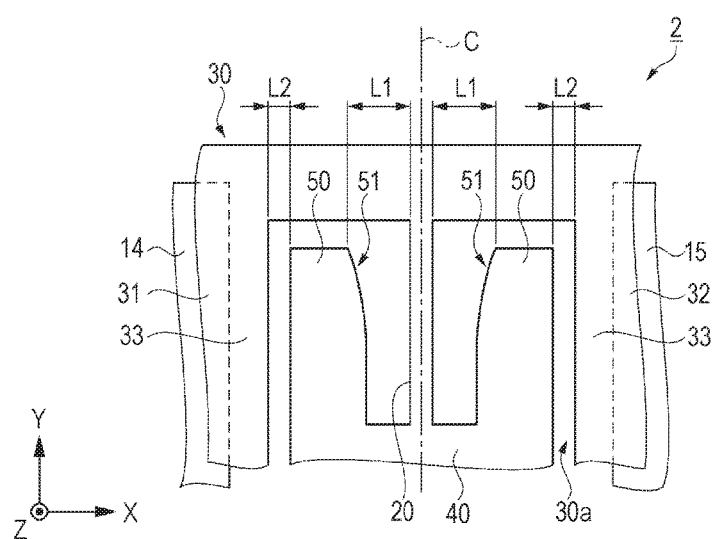
FIG. 5 is a schematic plan view showing the main portion of the acceleration sensor according to the first modification example of the first embodiment.

FIG. 5 is a schematic plan view showing the main portion of the acceleration sensor according to the first modification example of the first embodiment.

As shown in FIG. 5, in the acceleration sensor 2 of the first modification example, when seen in the plan view, an angle of a corner section 51 in the engaging section 50 is rounded like an arc shape. Further, in the acceleration sensor 2, the engaging section 50 not shown in the −Y side is also formed to be the same shape as the shown one.

According to this, the angle of a corner section 51 in the engaging section 50 is rounded like an arc shape in the acceleration sensor 2, when seen in the plan view. Therefore, even if the support beam 20 contacts with the corner section 51 of the engaging section 50, the rounding of the angle causes an impact force to be dispersed and thus it is possible to suppress the damage of the support beam 20.

Further, a curvature of the arc is appropriately set according to a ratio of L1 to L2, a flexibility of the support beam 20, or the like. Further, the angle of the corner section 51 of the engaging section 50 may be rounded using a combination of plural arcs, or a random curve instead of the arc.

Second Modification Example

Figure 6:
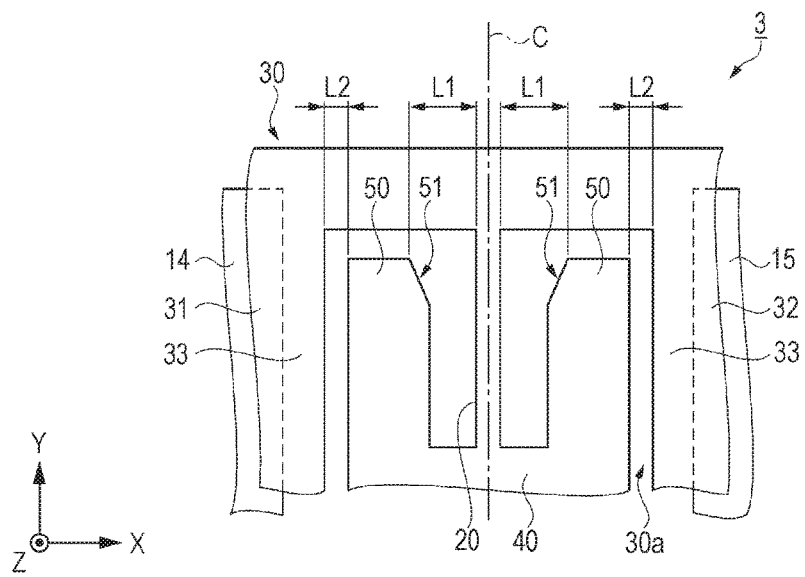
FIG. 6 is a schematic plan view showing the main portion of the acceleration sensor according to the second modification example of the first embodiment.

FIG. 6 is a schematic plan view showing the main portion of the acceleration sensor according to the second modification example of the first embodiment.

As shown in FIG. 6, in the acceleration sensor 3 of the second modification example, when seen in the plan view, an angle of a corner section 51 in the engaging section 50 is cut off. Further, in the acceleration sensor 3, the engaging section 50 not shown in the −Y side is also formed to be the same shape as the shown one.

According to this, the angle of a corner section 51 in the engaging section 50 is cut off in the acceleration sensor 3, when seen in the plan view. Therefore, even if the support beam 20 contacts the corner section 51 of the engaging section 50, the cut-off of the angle causes an impact force to be dispersed and thus it is possible to suppress the damage of the support beam 20.

Further, a cut-off of the corner is appropriately set according to a ratio of L1 to L2, a flexibility of the support beam 20, or the like.

Third Modification Example

Figure 7:
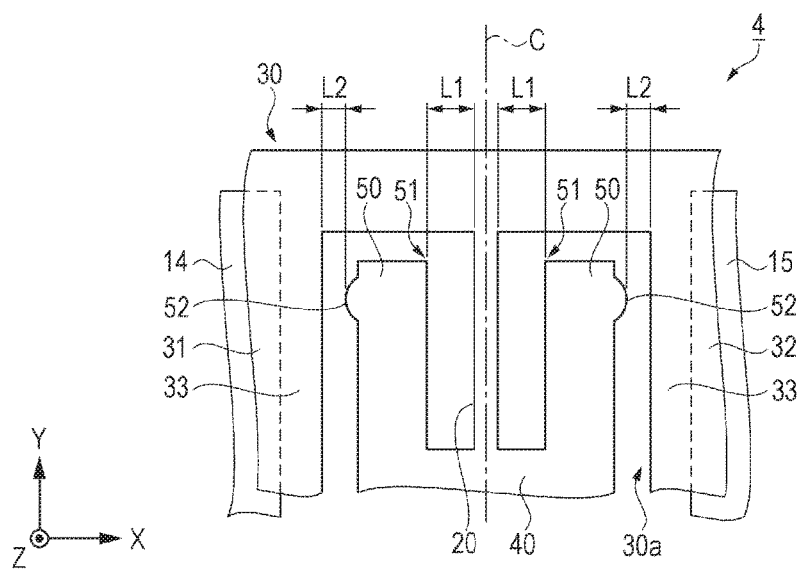
FIG. 7 is a schematic plan view showing the main portion of the acceleration sensor according to the third modification example of the first embodiment.

FIG. 7 is a schematic plan view showing the main portion of the acceleration sensor according to the third modification example of the first embodiment.

As shown in FIG. 7, in the acceleration sensor 4 of the third modification example, a protrusion section 52 which is a substantial semicircular shape in the plan view is provided on the engaging section 50 or the facing section 33 (herein, on the engaging section 50) to protrudes toward a mate side which faces the protrusion section 52. A gap between a tip of the protrusion section 52 and the facing mate (herein, the facing section 33) corresponds to L2. Further, in the acceleration sensor 4, the engaging section 50 not shown in the −Y side is also provided with the protrusion section 52 which is the same shape as the shown one.

According to this, in the acceleration sensor 4, a protrusion section 52 is provided on the engaging section 50 or the facing section 33 (herein, on the engaging section 50) to protrudes toward a mate side which faces the protrusion section 52, and a gap between a tip of the protrusion section 52 and the facing mate (herein, the facing section 33) corresponds to L2. Therefore, one (herein, the engaging section 50) on which the protrusion section 52 is provided can have a larger shape tolerance in portions (except for the portion related to L1) other than the protrusion section 52.

As a result, it is possible to improve the productivity because the shape tolerance is partly increased in the acceleration sensor 4, compared with a case where the protrusion section 52 is not provided.

Further, in the acceleration sensor 4, the protrusion section 52 causes the occurrence of attachment between the engaging section 50 and the facing section 33 to be avoided. Therefore, in the acceleration sensor 4, it is possible to improve a reliability of the acceleration detection.

Further, instead of the engaging section 50, the facing section 33 may be also provided with the protrusion section 52. Further, the configuration having the protrusion section 52 may be also applied to the above first modification example, the above second modification example, and the second embodiment to be described later.

Further, the configurations described above in the first modification example and the second modification example may be also applied to the second embodiment to be described later.

Second Embodiment

Hereinafter, the acceleration sensor of the second embodiment will be described.

Figure 8A:
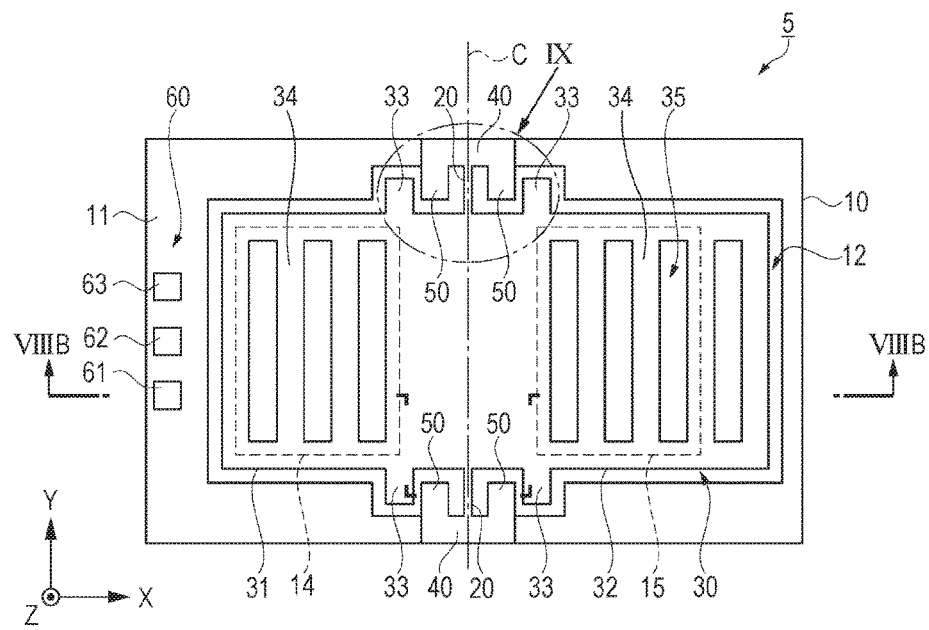
FIG. 8A and FIG. 8B are schematic views showing a configuration of an acceleration sensor according to the second embodiment.
Figure 8B:
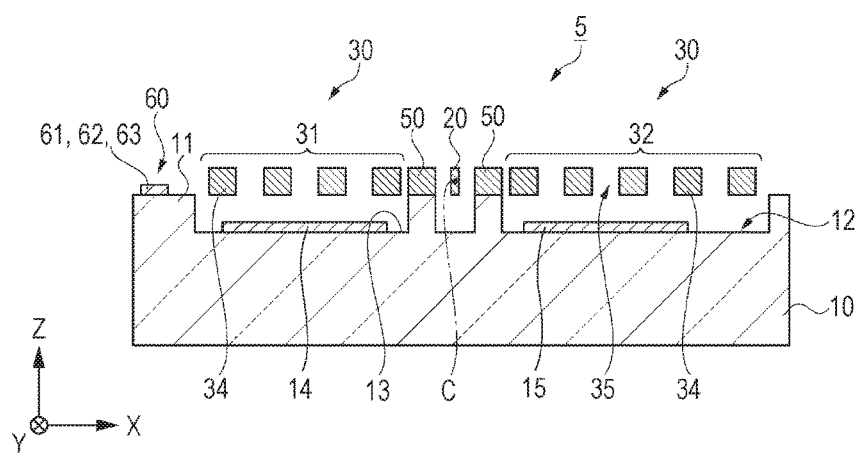
Figure 9:
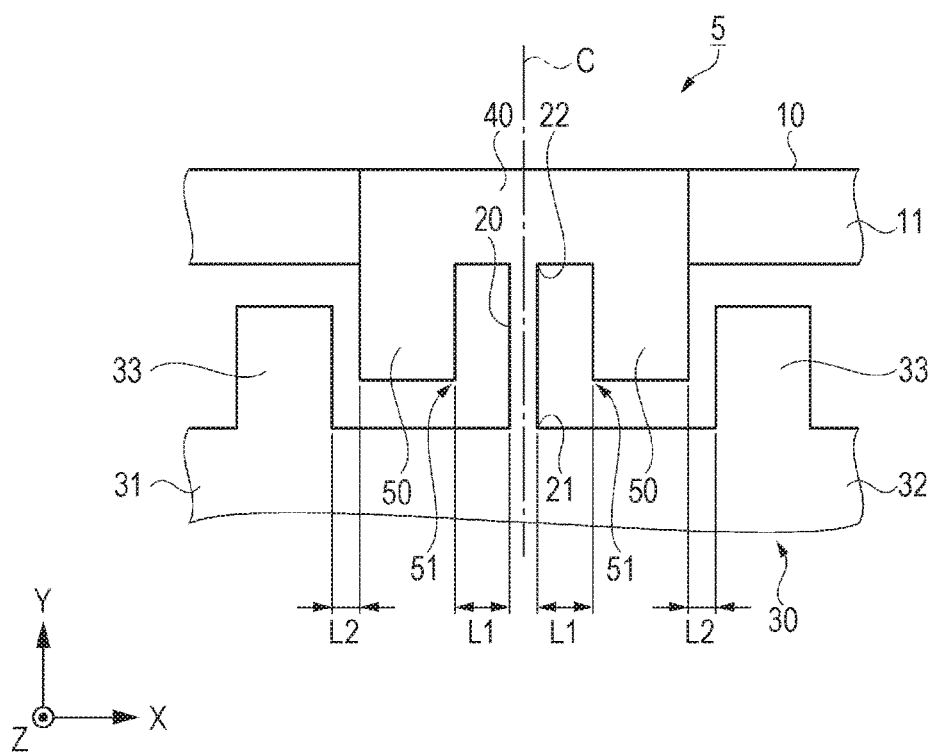
FIG. 9 is a schematic enlarged view showing portion IX surrounded with a two-dotted chain line in FIG. 8A.

FIG. 8A and FIG. 8B are schematic views showing a configuration of an acceleration sensor according to the second embodiment. FIG. 8A is a schematic plan view and FIG. 8B is a schematic sectional view taken along line VIIIB-VIIIB of FIG. 8A. FIG. 9 is a schematic enlarged view showing portion IX surrounded with a two-dotted chain line in FIG. 8A. Further, like numbers will be assigned to portions which are the same as in the first embodiment, the description thereof will not be repeated, and portions different from those in the first embodiment will mainly be described.

As shown in FIG. 8A, FIG. 8B and FIG. 9 in the acceleration sensor 5 of the second embodiment, a pair of support beams 20, the stationary section 40, and the engaging section 50 are disposed outside the weight body 30, when seen in the plan view.

More specifically, in the acceleration sensor 5, the stationary sections 40 are disposed on the +Y side and on the −Y side of the weight body 30, respectively, so as to interpose the weight body 30 between stationary sections in the Y axis direction, and the peripheral edge of the weight body 30 and the pair of the stationary sections 40 are connected to each other through the pair of support beams 20.

The engaging sections 50 extend from the respective stationary sections 40 along the Y axis in a substantially rectangular shape so as to interpose the support beam 20 between two sides of the engaging section in the −X side and +X side.

The first weight section 31 and the second weight section 32 respectively include a facing section 33 which extends in the Y axis to face a side of the engaging section 50 opposite to a side facing the support beam 20.

In the acceleration sensor 5 having such a configuration, also the relational expression, L1>L2 is satisfied like the case of the first embodiment.

As described above, in the acceleration sensor 5 of the second embodiment, the pair of support beams 20, the pair of the stationary sections 40, and the engaging section 50 are disposed outside the weight body 30, when seen in the plan view. Therefore, the opening 30a (see FIG. 1A and FIG. 1B) of the weight body 30 is not necessary in the acceleration sensor 5 of the second embodiment, in contrast to the first embodiment having a case where the support beam 20, the stationary section 40, and the engaging section 50 are disposed inside the weight body 30.

Therefore, according to the acceleration sensor 5, the mass of the weight body 30 can be increased, and thus it is possible to improve the impact resistance and also to improve the sensitivity of the acceleration detection in the Z axis direction, even in a case where the external size of the weight body 30 of the acceleration sensor 5 is the same as that of other configurations.

As described above, the physical quantity sensor of which a typical example is the acceleration sensor includes the functional element described above. Therefore, it is possible to provide a physical sensor having the effects described in the above embodiments and the modification examples.

Electronic Apparatus

Hereinafter, an electronic apparatus including the functional element described above will be described.

Figure 10:
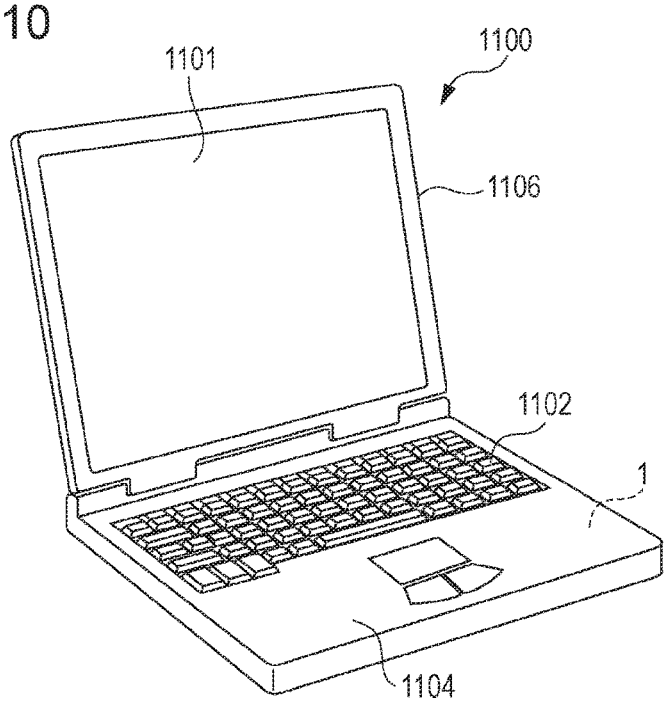
FIG. 10 is a schematic perspective view showing a configuration of a mobile type (or notebook type) personal computer as the electronic apparatus including the functional element.

FIG. 10 is a schematic perspective view showing a configuration of a mobile type (or notebook type) personal computer as an electronic apparatus including the functional element.

As shown in FIG. 10, a personal computer 1100 is configured to include a main body section 1104 having a keyboard 1102, and a display unit 1106 having a display section 1101. The display unit 1106 is rotatably supported on the main body section 1104 through a hinge structure section.

Such a personal computer 1100 includes a built-in acceleration sensor 1 (or any one of 2 to 5) as a physical sensor including the functional element.

Figure 11:
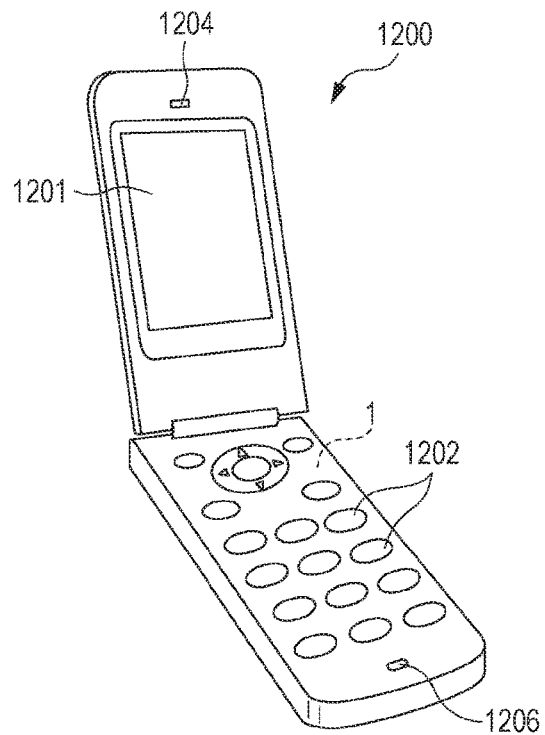
FIG. 11 is a schematic perspective view showing a configuration of a mobile phone (also including PHS) as the electronic apparatus including the functional element.

FIG. 11 is a schematic perspective view showing a mobile phone (also including PHS) as an electronic apparatus including the functional element.

As shown in FIG. 11, a mobile phone 1200 includes plural operating buttons 1202, an earpiece 1204 and a mouthpiece 1206. A display section 1201 is disposed between the operating button 1202 and the earpiece 1204.

Such a mobile phone 1200 includes a built-in acceleration sensor 1 (or any one of 2 to 5) as a physical sensor including the functional element.

Figure 12:
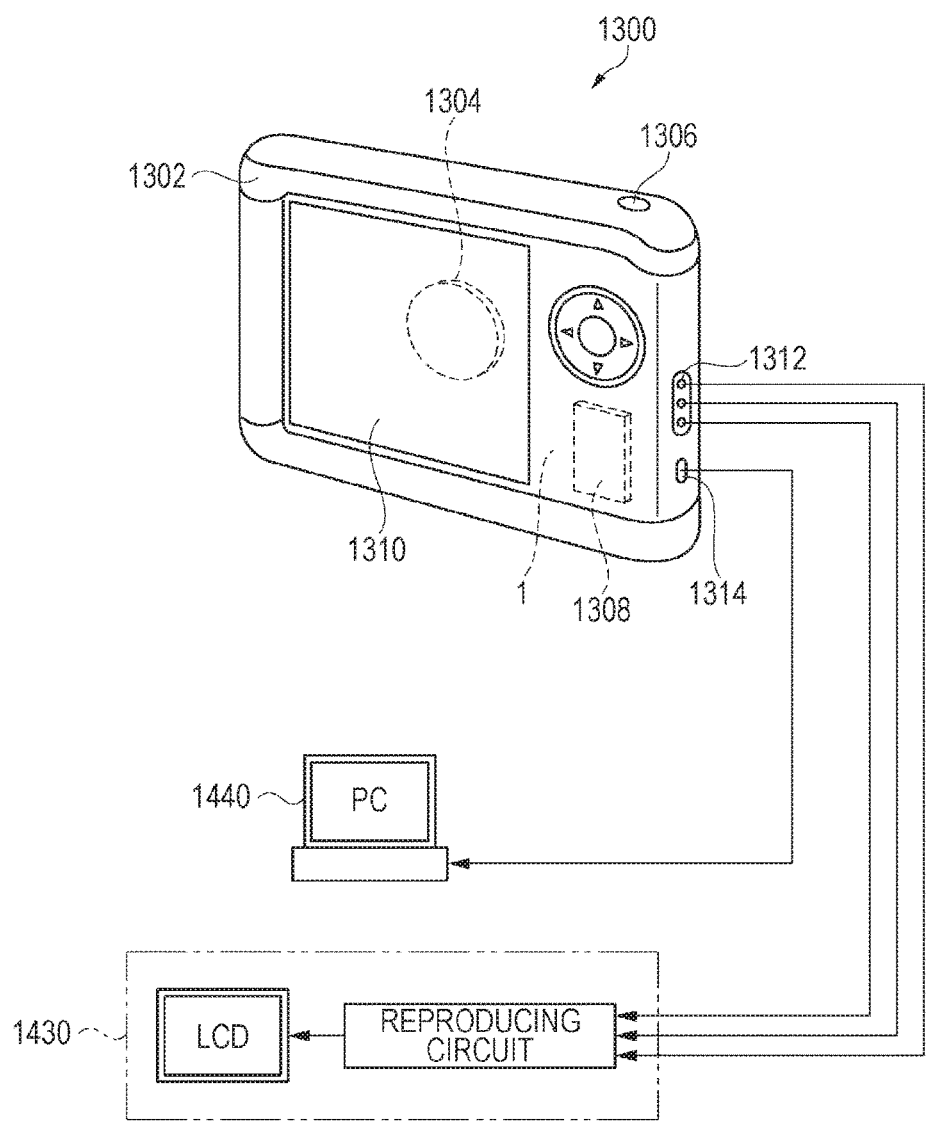
FIG. 12 is a schematic perspective view showing a digital still camera as the electronic apparatus including the functional element.

FIG. 12 is a schematic perspective view showing a digital still camera as an electronic apparatus including the functional element. Further, in FIG. 12, a connection with an external device is also simply shown.

Herein, generally, in a typical camera, a light image of a subject causes a silver salt photographic film to be exposed to light, whereas a digital still camera 1300 performs a photoelectric conversion on a light image of a subject using an imaging element such as a charge coupled device (CCD) so as to generate an imaging signal (an image signal).

A display section 1310 is provided on the rear surface (front of the drawing) of the case (body) 1302 in the digital still camera 1300 and is configured to perform a displaying process based on the imaging signal generated by the CCD. Further, the display section 1310 may function as a finder for displaying a subject as an electronic image.

Further, a light receiving section 1304 including optical lenses (imaging optical system), CCD or the like is provided on the front side (back side in the drawing) of the case 1302.

If a photographer notices a subject image displayed on the display section 1310 and presses the shutter button 1306, an imaging signal of the CCD at that time is transmitted to and stored in a memory 1308.

Further, a video signal output terminal 1312 and an input-output terminal 1314 for data communication are provided on a side surface of the case 1302 in the digital still camera 1300. Further, the video signal output terminal 1312 may be connected to a television monitor 1430, and the input-output terminal 1314 for data communication may be connected to a personal computer 1440, respectively, if necessary. Further, a configuration is provided in which a predetermined operation causes the imaging signal stored in the memory 1308 to be output to the television monitor 1430 or the personal computer 1440.

Such a digital still camera 1300 includes a built-in acceleration sensor 1 (or any one of 2 to 5) as a physical sensor including the functional element.

The electronic apparatuses include the physical quantity sensor having the functional element to thereby be capable of having the effect described in the above embodiments and the above modification examples and an excellent performance.

In addition to such electronic apparatuses, the electronic apparatuses having the functional element may include an ink jet type discharging device (for example, an ink jet printer), a laptop type personal computer, a television, a video camera, a video tape recorder, various types of navigation devices, a pager, an electronic notebook (also including a communicative function), an electronic dictionary, an electronic calculator, an electronic game device, a word processor, a work station, a picturephone, a television monitor for crime prevention, electronic binoculars, a POS terminal, medical equipment (for example, electronic thermometer, sphygmomanometer, a blood glucose meter, an electrocardiogram measurement device, ultrasonic diagnostic equipment, or an electronic endoscope), a fishfinder, various measuring equipment, instruments, a flight simulator, and the like.

In any case, these electronic apparatuses include the functional element described above to thereby be capable of having the effect described in the above embodiments and the above modification examples and an excellent performance.

Mobile Entity

Hereinafter, a mobile entity including the functional element described above will be described.

Figure 13:
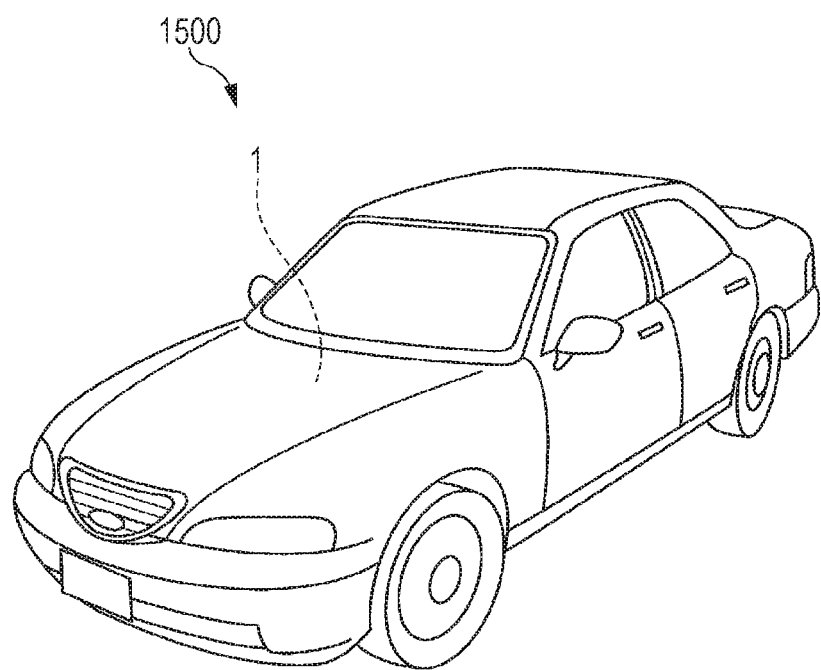
FIG. 13 is a schematic perspective view showing a car as an example of a mobile entity including the functional element.
Figure 14A:
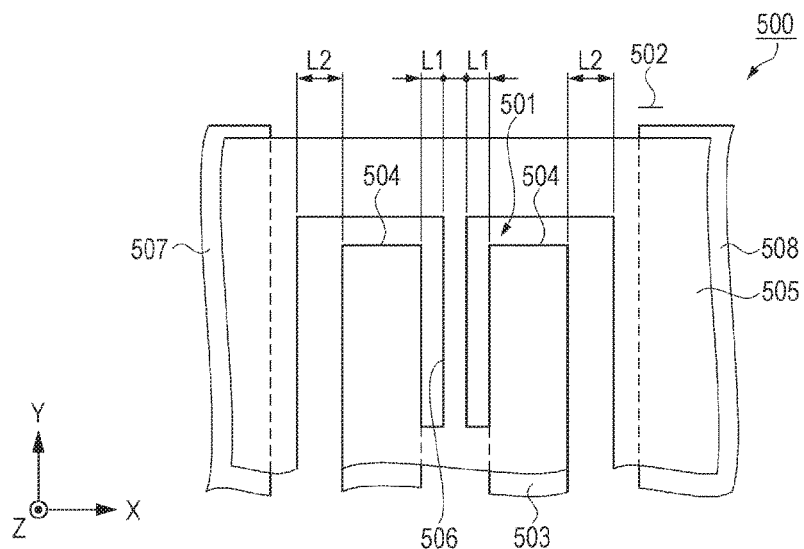
FIG. 14A and FIG. 14B are schematic plan views showing a configuration of a main portion of an acceleration sensor according to the related art.
Figure 14B:
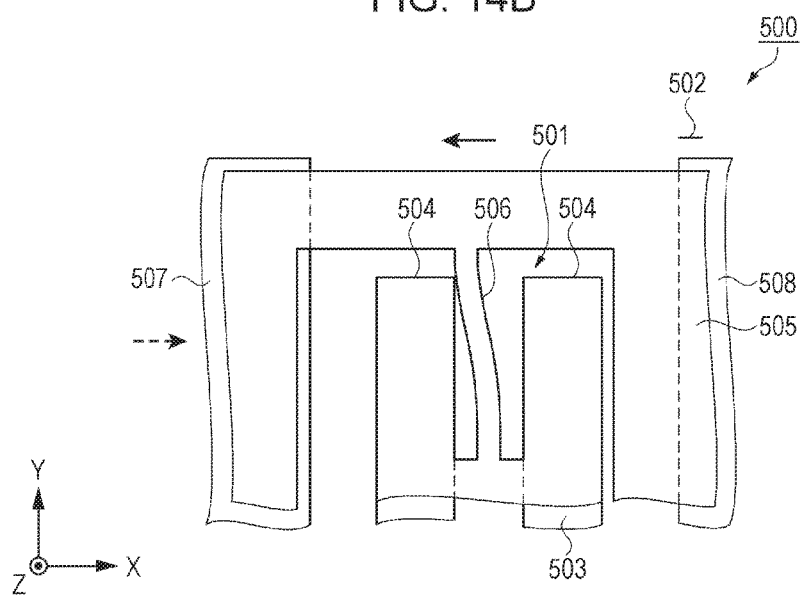

FIG. 13 is a schematic perspective view showing a car as an example of a mobile entity including the functional element.

In a car 1500, the acceleration sensor 1 (or any one of 2 to 5) as a physical quantity sensor including the functional element is used as, for example, a posture detecting sensor for the mounted-in navigation apparatus, a posture controlling apparatus and the like.

Therefore, the car 1500 includes the physical quantity sensor including the functional element described above to thereby be capable of having the effect described in the above embodiments and the above modification examples and an excellent performance.

The functional element described above is not limited to the application of the car 1500, but may be used as a main constitutional element in the posture detecting sensor of the mobile entity including a self-propelled robot, a self-propelled transfer apparatus, a train, a vessel, an airplane, a satellite and the like. In any case, it is possible to provide a mobile entity having the effect described in the above embodiments and the above modification examples and an excellent performance.

Further, the functional element having this configuration may be applied to various angular velocity sensors and the like, in addition to the acceleration sensor.

What is claimed is:

1. A functional element comprising:
a substrate on which first and second stationary electrodes are provided, the first and second stationary electrodes being arranged next to each other;
a weight body that is configured with:
 a first weight member facing the first stationary electrode via a gap;
 a second weight member facing the second stationary electrode via a gap; and
 a stationary member that is disposed between the first and second weight members;
an engaging section that is part of the stationary member, the engaging section being fixed to the substrate; and
a support beam that connects the stationary member to the first and second weight members, the support beam extending along a first direction, the first direction being perpendicular to an arranging direction of the first and second weight members,
wherein the engaging section is fixed to the substrate at a first position that is spaced apart from the support beam in a plan view,
wherein a corner of the engaging section closest to the support beam is one of a cut-off corner and a round corner, and
wherein the weight body is swingable around the support beam as an axis in a second direction which is an overlapping direction of the substrate and the weight body,
a distance between the engaging section and the support beam in a third direction which is perpendicular to the first and second directions is L1, and a distance between the engaging section and the first weight member in the third direction is L2, and
L1>L2.

2. The functional element according to claim 1,
wherein the engaging section, the stationary member, and the support beam are disposed inside of a periphery of the weight body in a plan view in the second direction.

3. The functional element according to claim 1,
wherein the substrate has a projection at the first position, and the projection is located between the first and second stationary electrodes, and
the engaging section is fixed to the projection.

4. The functional element according to claim 3,
wherein one of the engaging section and the weight body located next to each other has a protrusion, and the protrusion protrudes toward to the other of the engaging section and the weight body, and
a distance between a tip of the protrusion and the other of the engaging section and the weight body is the distance L2.

5. The functional element according to claim 3,
wherein the projection is configured with first and second projections, and the engaging section is configured with first and second engaging sections, and
the first and second engaging sections are fixed to the first and second projections, respectively.

6. The functional element according to claim 3,
wherein the substrate has a recess, and the projection projects from a bottom of the recess, and the first and second stationary electrodes are formed on the bottom of the recess.

7. The functional element according to claim 1,
wherein one of the engaging section and the weight body located next to each other has a protrusion, and the protrusion protrudes toward to the other of the engaging section and the weight body, and
a distance between a tip of the protrusion and the other of the engaging section and the weight body is the distance L2.

8. The functional element according to claim 1,
wherein the stationary member has first and second ends in the first direction,
the support beam is configured with first and second support beams,
the first support beam connects the first end of the stationary member to the first and second weight members, and the second support beam connects the second end of the stationary member to the first and second weight members.

9. The functional element according to claim 1,
wherein a mass of the first weight member is smaller than a mass of the second weight member.

10. The functional element according to claim 1,
wherein the weight body is made of silicon.

11. The functional element according to claim 10,
wherein the substrate is made of an insulation material.

12. The functional element according to claim 1,
wherein an overlapped area of the first weight member and the first stationary electrode in the second direction is a first movable electrode,
an overlapped area of the second weight member and the second stationary electrode in the second direction is a second movable electrode,
the first stationary electrode is configured to detect a capacitance generated between the first stationary electrode and the first weight member, and
the second stationary electrode is configured to detect a capacitance generated between the second stationary electrode and the second weight member.

13. The functional element according to claim 1,
wherein each of the first and second weight members has a through hole.

14. The functional element according to claim 1,
wherein the functional element is an acceleration sensor.

15. An electronic apparatus comprising:
the functional element according to claim 1;
a display; and
a case housing the functional element and the display.

16. A mobile entity comprising:
the functional element according to claim 1: and
a moveable body housing the functional element.

17. A functional element comprising:
a substrate on which first and second stationary electrodes are provided, the first and second stationary electrodes being arranged next to each other;
a weight body that is configured with:
 a first weight member facing the first stationary electrode via a gap;
 a second weight member facing the second stationary electrode via a gap; and
 a stationary member that is disposed between the first and second weight members;
an engaging section that is part of the stationary member, the engaging section being fixed to the substrate; and
a support beam that connects the stationary member to the first and second weight members, the support beam extending along a first direction, the first direction being perpendicular to an arranging direction of the first and second weight members, wherein the weight body is swingable around the support beam as an axis in a second direction which is an overlapping direction of the substrate and the weight body, one of the engaging section and the weight body located next to each other has a protrusion, and the protrusion protrudes toward to the other of the engaging section and the weight body, a distance between the engaging section and the support beam in a third direction which is perpendicular to the first and second directions is L1, and a distance between a tip of the protrusion and the other of the engaging section and the weight body in the third direction is L2, and

L1 >L2.

18. The functional element according to claim 17, wherein the engaging section, the stationary member, and the support beam are disposed inside of a periphery of the weight body in a plan view in the second direction.

19. The functional element according to claim 17, wherein the substrate has a projection, and the projection is located between the first and second stationary electrodes, and the engaging section is fixed to the projection.

20. The functional element according to claim 17, wherein a corner of the engaging section closest to the support beam is one of a cut-off corner and a round corner.

* * * * *